United States Patent
Wang et al.

(10) Patent No.: US 9,498,898 B2
(45) Date of Patent: Nov. 22, 2016

(54) CLEANING MECHANISM FOR SEMICONDUCTOR SINGULATION SAWS

(71) Applicants: Zhijie Wang, Tianjin (CN); Zhigang Bai, Tianjin (CN); Mei Liu, Tianjin (CN); Jiyong Niu, Tianjin (CN); Zhimei Sun, Tianjin (CN); Huchang Zhang, Tianjin (CN)

(72) Inventors: Zhijie Wang, Tianjin (CN); Zhigang Bai, Tianjin (CN); Mei Liu, Tianjin (CN); Jiyong Niu, Tianjin (CN); Zhimei Sun, Tianjin (CN); Huchang Zhang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 161 days.

(21) Appl. No.: 14/555,562

(22) Filed: Nov. 26, 2014

(65) Prior Publication Data

US 2015/0367529 A1 Dec. 24, 2015

(30) Foreign Application Priority Data

Jun. 24, 2014 (CN) .......................... 2014 1 0285812

(51) Int. Cl.
| | | |
|---|---|---|
| *B28D 7/02* | (2006.01) | |
| *H01L 21/67* | (2006.01) | |
| *B28D 5/02* | (2006.01) | |
| *B28D 1/04* | (2006.01) | |

(52) U.S. Cl.
CPC . *B28D 7/02* (2013.01); *B28D 1/04* (2013.01); *B28D 5/022* (2013.01); *H01L 21/67046* (2013.01); *H01L 21/67092* (2013.01)

(58) Field of Classification Search
CPC .......... B28D 7/02; B28D 5/022; B28D 1/04; B08B 1/04; H01L 21/67092
USPC ........... 451/443, 444, 56, 72, 21; 125/13.01, 125/11.01, 11.18, 11.16, 129
See application file for complete search history.

(56) References Cited

U.S. PATENT DOCUMENTS

| | | | | |
|---|---|---|---|---|
| 2,706,503 A | * | 4/1955 | Zook | B23Q 11/02 15/256.6 |
| 2,770,925 A | * | 11/1956 | Wallace | B24B 53/12 125/11.01 |
| 3,407,800 A | * | 10/1968 | Hoare | B24B 53/14 125/11.03 |
| 3,568,377 A | * | 3/1971 | Blohm | B24B 55/02 451/444 |
| 4,344,260 A | | 8/1982 | Ogiwara | |
| 5,000,156 A | | 3/1991 | Honda | |
| 5,144,938 A | * | 9/1992 | Seeburger | B28D 5/028 125/11.04 |
| 7,086,394 B2 | | 8/2006 | Smith | |

FOREIGN PATENT DOCUMENTS

CN           102347275           2/2014

* cited by examiner

*Primary Examiner* — Robert Rose
(74) *Attorney, Agent, or Firm* — Charles E. Bergere

(57) ABSTRACT

A cleaning subsystem removes unwanted material, such as glaze, from saw blades used in a semiconductor singulation process. A cleaning module moves radially towards the saw blade and vertically with respect to the plane of the saw blade in order to enable abrasive cleaning blocks of the cleaning module to selectively remove material from either the upper and lower surfaces of the saw blade or the outer edge of the saw blade. The cleaning assembly can remove material from the saw blade at a predetermined time or position during the singulation process or upon detection of load imbalance during the rotation of the saw blade.

16 Claims, 4 Drawing Sheets

US 9,498,898 B2

CLEANING MECHANISM FOR SEMICONDUCTOR SINGULATION SAWS

BACKGROUND OF THE INVENTION

The present invention relates generally to saws used during the semiconductor device assembly process and, more particularly, to a saw with a self-sharpening blade used during semiconductor device assembly.

It is known to use saws during the assembly of semiconductor devices, such as for cutting dies from a wafer. Additionally, during the semiconductor device assembly process, multiple semiconductor devices can be formed simultaneously on a one- or two-dimensional assembly of lead frames called a lead frame array. In order to finish assembly of the semiconductor devices, the lead frames of the array undergo a singulation process using a saw or laser. Additionally, saws are used to singulate integrated circuit dies fabricated on semiconductor wafers. When using a saw to perform the singulation process, a self-sharpening saw blade may be used to maintain the sharpness of the saw blade.

FIG. 1A shows a stylized close up view of a portion of a self-sharpening saw blade 101. The self-sharpening saw blade 101 has pieces of material called grit 102, such as bits of diamond, embedded in a bond material 103, such as nickel. When the self-sharpening saw blade 101 cuts material, chip pockets 104 take the cut material away from the area where the cutting occurs. The chip pockets 104 also carry water to the cutting area for cooling.

The bond material 103 that holds the grit 102 is gradually worn away during the cutting process. As the bond material 103 wears away, grit that had been held within the bond material 103 falls away exposing new grit. The wearing away of the bond material 103 and the exposure of new grit is referred to as self-sharpening.

As shown in FIG. 1B, sometimes during the cutting process, the grit 102, bond material 103, and/or chip pockets 104 can be covered with a glaze 105 formed by the material from the objects being cut, such as silicon wafers. The glaze 105 can inhibit the self-sharpening function of the saw blade 101 and cause the saw blade 101 to damage the wafer being cut, causing die edge chipping or peeling.

It would be advantageous to have a self-sharpening saw for use in semiconductor device assembly that does not damage the integrated circuit dies being packaged.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Figure 1A:
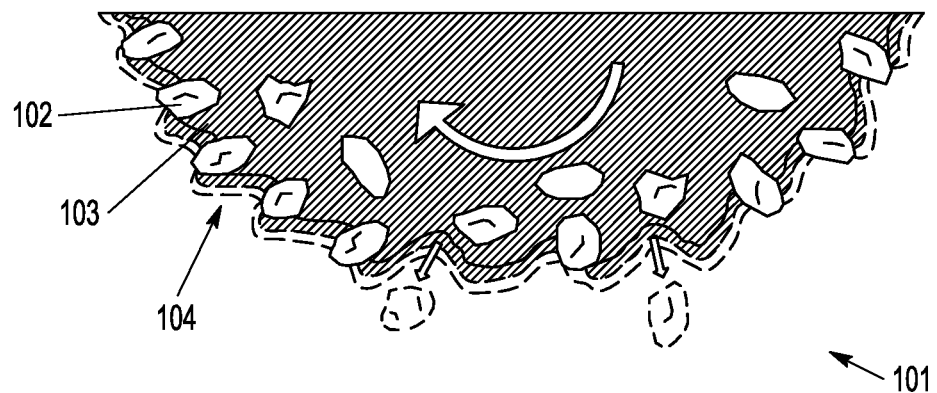
FIGS. 1A and 1B show simplified close up views of a conventional self-sharpening saw blade.
Figure 1B:
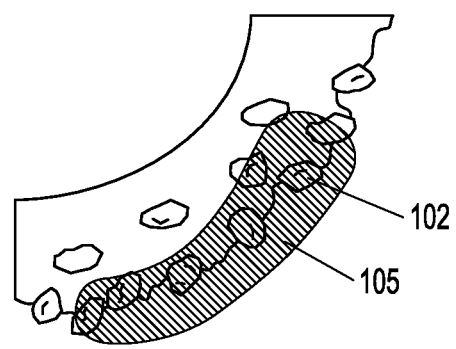

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Self-sharpening saw blades enhance the singulation process that occurs during the wafer saw process. However, the formation of glaze on self-sharpening saw blades impacts the cutting ability of the blades by preventing exposure of new grit, thereby inhibiting the self-sharpening function. Furthermore, the presence of the glaze will decrease the sharpness of the blade, which increases the mechanical stress placed on the blade during cutting, which can cause chipping and peeling of the integrated circuit die.

An embodiment of the invention is an apparatus for singulating semiconductor devices. The apparatus comprises a spindle module that rotates a saw blade used to saw through wafers or a multi-device array during a singulation process. The apparatus further comprises a moveable cleaning module that translates relative to the spindle module to achieve a position at which the cleaning module removes material from the saw blade.

Another embodiment of the invention is a method for removing material from a saw blade of a saw used to cut through wafers or a multi-device array during a singulation process. The method comprises rotating the saw blade on a spindle module of the singulation saw, and moving a cleaning module of the singulation saw relative to the spindle module to remove the material from the saw blade.

Figure 2A:
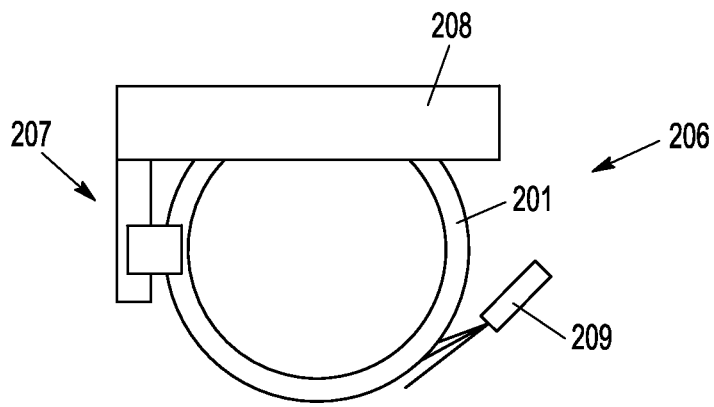
FIG. 2A shows a side view and FIGS. 2B-2E show simplified top down views of a singulation saw according to an embodiment of the present invention.

Referring now to FIG. 2A, a side view of a singulation saw 206 for cutting a wafer, in accordance with an embodiment of the present invention, is shown. The singulation saw 206 comprises (i) a self-sharpening saw blade 201 used to cut through a wafer (not shown) during a singulation process and (ii) a cleaning subsystem 207 used to clean the self-sharpening saw blade 201. As shown, a cover 208 may shield a portion of the saw blade 201 in order to provide protection during the cutting process. Located proximate to the saw blade 201 is a coolant dispenser 209 that provides coolant, such as water, to the saw blade 201 in order to prevent the saw blade 201 from overheating. The coolant that comes out of the dispenser 209 can also wash away silicon dust, generated during the wafer cutting process, from the saw street area as well as surface of the saw blade.

Figure 2B:
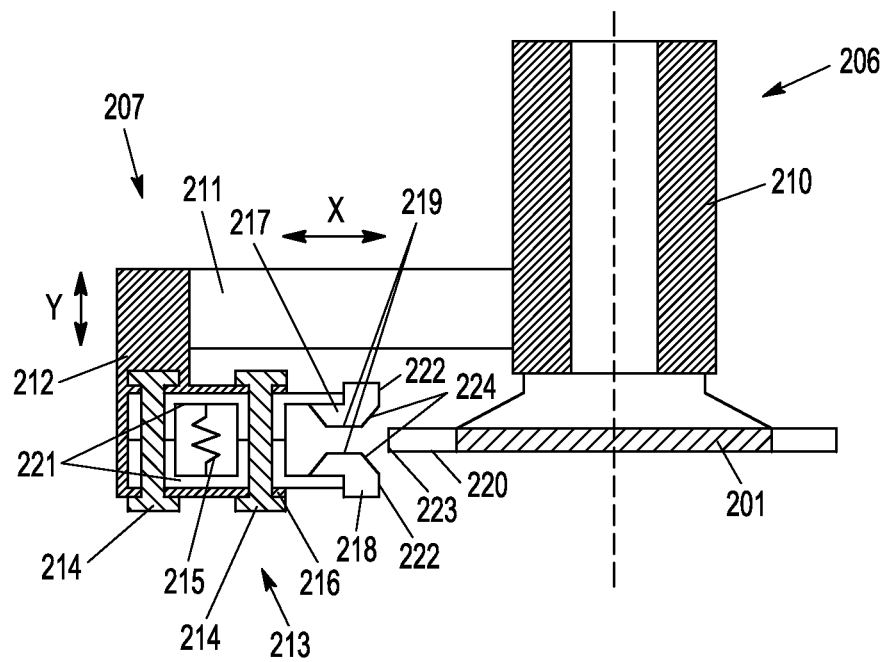

FIG. 2B is a simplified plan view of the singulation saw 206 of FIG. 2A. Shown in FIG. 2B is a spindle module 210 that holds and rotates the saw blade 201. A Micro-controller sits on a PCB board located in a card rack of the singulation saw 206, for controlling the rotation of the saw blade 201 as well as controlling the cleaning subsystem 207. The controller also receives signals based upon the loading current, which reflects indirectly the mechanical load that occurs to a saw blade while cutting through a wafer. Since microcontrollers used in known semiconductor assembly processes are well known, further detailed description except as particular to the present invention is not provided.

The cleaning subsystem 207 comprises an X-axis guide 211, a Y-axis guide 212, and movable cleaning module 213, which further comprises guiding pillars 214, spring 215, stopper structure 216, first and second cleaning blocks 217 and 218, and surface-cleaning surfaces 219. The cleaning subsystem 207 performs a cleaning process that removes material from the saw blade 201 by moving the cleaning module 213 into positions where one or both of the cleaning blocks 217 and 218 come into contact with, and thereby remove, material, such as glaze, that can adversely impact the cutting ability of the saw blade 201.

One or more linear servo motors (not shown) move the cleaning module 213 along the X-axis guide 211 and the Y-axis guide 212. The X-axis guide 211 allows movement of the cleaning module 213 along the X-axis with respect to the saw blade 201. The Y-axis guide 212 allows movement of the cleaning module 213 along the Y-axis with respect to the saw blade 201.

The moving distances along the X-axis guide 211 are determined by the controller using radius measurement data about the saw blade 201. Radius measurement data of the saw blade refers to the measurement of the radius of the saw blade and can be periodically determined using a touchdown sensor (not shown) located on the singulation saw. During radius measurement determination, the singulation saw 206 will stop the saw blade 201 from rotating, and the saw blade 201 will be indexed into a specified position where the touchdown sensor is located, the saw blade 201 will be moved until the touchdown sensor is contacted, and the controller will compute the radius based on the distance moved.

The guiding pillars 214, spring 215, and stopper structure 216 control the positions of the first and second cleaning blocks 217 and 218 during the cleaning process. The guiding pillars 214 are parallel with each other, elongated structures that are attached to the stopper structure 216. The guiding pillars 214 ensure that the surface-cleaning surfaces 219 of the cleaning blocks 217, 218 remain parallel with respect to each other during the cleaning process.

The guiding pillars 214 in cooperation with the spring 215, further permit the first and second cleaning blocks 217 and 218 to have relative Y-axis movement with respect to each other so that the distance therebetween is adjustable by action of the spring 215 depending on the thickness of the saw blade 201 (i.e., the distance between upper and lower surfaces 220 at the periphery of the saw blade 201).

The embodiment of FIG. 2B has two guiding pillars 214. Other embodiments may have other numbers of guiding pillars or other mechanisms that ensure that the surface-cleaning surfaces 219 of the two cleaning blocks 217, 218 remain parallel with respect to each other.

The cleaning module 213 is designed to establish an operating range of separation distances between the surface-cleaning surfaces 219 of the two cleaning blocks 217 and 218 between a selected minimum separation distance and a selected maximum separation distance. Depending on the situation, the minimum separation distance may be selected to be equal to the original thickness of the installed saw blade 201 (or alternatively slightly larger than or slightly smaller than the original blade thickness), while the maximum separation distance may be selected to be equal to a certain percentage, e.g., 10%, greater than the original blade thickness.

Without anything inserted between the two cleaning blocks 217 and 218, the (pre-loaded) spring 215 will maintain the separation distance between the cleaning blocks 217, 218 to be at the selected minimum separation distance. If a blade, having an actual thickness greater than the selected minimum separation distance due, e.g., to a build-up of glaze, is inserted between the two cleaning blocks 217-218, then the two cleaning blocks 217-218 will be forced further apart. As a result, the spring 215 will apply a restorative force to attempt to drive the separation distance between the two cleaning blocks 217-218 back to the minimum separation distance, resulting in the surface-cleaning surfaces 219 of the two cleaning blocks 217-218 applying grinding pressure onto the respective upper and lower surfaces 220 of the saw blade 201 while the blade 201 is in high speed rotation cutting through the wafer, thereby cleaning (e.g., removing glaze from) those surfaces. The spring 215 is preferably located between the guiding pillars 214 and is attached to cleaning block holders 221.

If an attempt is made to insert a saw blade, having a thickness greater than the maximum separation distance, between the two cleaning blocks 217-218, then the separation distance between the two cleaning blocks 217-218 will reach and try to exceed that maximum separation distance. As a safety measure, the cleaning module 213 can be configured with a mechanical limit sensor (not shown) that detects this situation and, for example, causes the saw to shut down or otherwise stop the singulation process.

The first and second cleaning blocks 217 and 218 may be made of abrasive material, such as blocks of aluminum oxide or silicon carbide. Alternatively, the cleaning blocks 217-218 may be made of an abrasive material bonded to a ceramic base. The cleaning blocks 217-218 have surface-cleaning surfaces 219 that respectively clean the upper and lower surfaces 220 of the saw blade 201. The cleaning blocks 217-218 also have edge-cleaning surfaces 222 that are orthogonal to the surface-cleaning surfaces 219. Each of the edge-cleaning surfaces 222 can be used to clean an outer edge 223 of the saw blade 201. The cleaning blocks 217-218 also have angled surfaces 224 between the surface-cleaning surfaces 219 and the edge-cleaning surfaces 222. The angled surfaces 224 can help guide the saw blade 201 between the two cleaning blocks 217-218 during translation along the X-axis.

FIG. 2B shows the cleaning module 213 in its "home" position. The controller will determine the X-axis location of the home position for the cleaning module 213 from a saw blade parameter in a dicing saw program, the feed distance of the cleaning module 213 is determined from the feedback of the touchdown sensor regarding the radius of the saw blade 201. Note that the pre-programmed Y-axis location of the home position is independent of the radius and thickness of the saw blade 201.

Figure 2C:
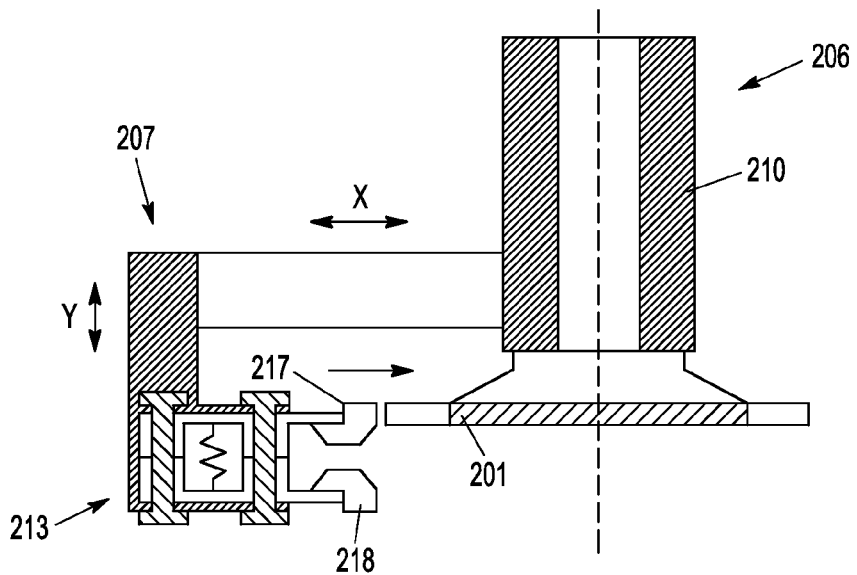

FIG. 2C shows the singulation saw 206 after the cleaning module 213 has been moved along the Y-axis from the home position shown in FIG. 2B.

Figure 2D:
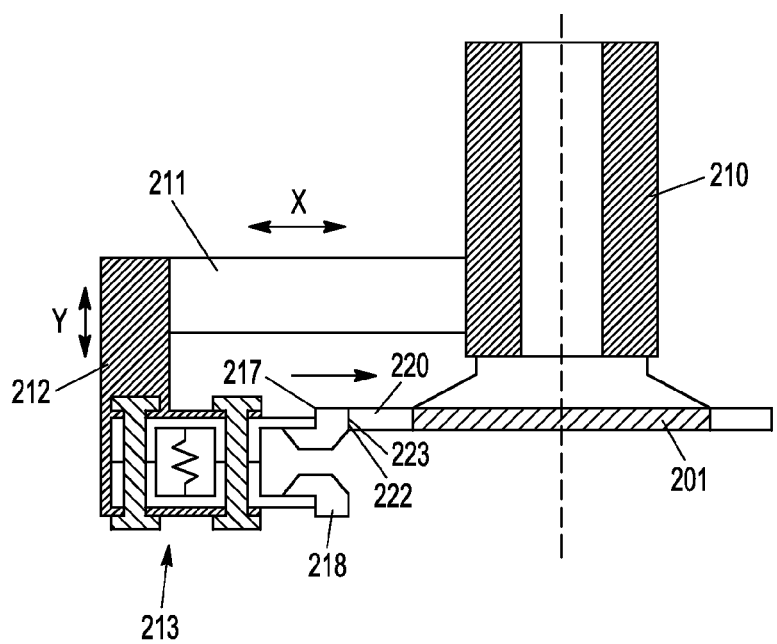

FIG. 2D shows the singulation saw 206 after the cleaning module 213 has been moved along the X-axis from the position shown in FIG. 2C towards the saw blade 201 so that the edge-cleaning surface 222 of the first cleaning block 217 is contacting and removing material, such as glaze, from the outer edge 223 of the saw blade 201. It should be understood that second cleaning block 218 may also be used to clean the outer edge 223 and can do so at alternate intervals with respect to the first cleaning block 217.

Figure 2E:
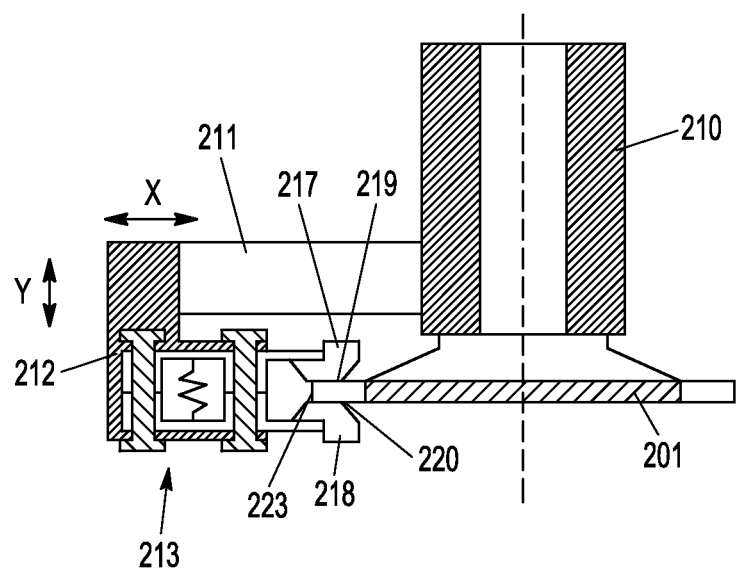

FIG. 2E shows the singulation saw 206 after the cleaning module 213 has been moved along the X-axis from the home position of FIG. 2B towards the saw blade 201 to a position where the upper and lower surfaces 220 of the saw blade 201 are being cleaned by the surface-cleaning surfaces 219 of the two cleaning blocks. Here, too, material, such as glaze, may be removed from the upper and lower surfaces 220 of the saw blade 201.

In certain implementations, the controller automatically moves the cleaning module 213 based upon detection of a specified condition, such as when a predetermined number of cuts have been performed using the saw blade or after a predetermined amount of time has passed or when an abnormally high loading current is detected. When one of these conditions is detected, the controller orchestrates the moving of the cleaning module 213 along the X-axis and Y-axis, as needed, towards the saw blade 201 to perform a cleaning operation. Upon completion of the cleaning operation, the controller returns the cleaning module 213 to its home position.

By operating the cleaning subsystem 207 in the manner discussed above, the saw blade 201 may be cleaned at the same time that it continues to be used to singularize semiconductor wafers such that there is no loss in the equipment capacity. By using distinct surface-cleaning surfaces 219 and edge-cleaning surfaces 222, cleaning of the upper and lower surfaces 220 and the outer edge 223 of the saw blade 201 can be performed separately. This minimizes the mechanical stresses applied to the saw blade 201 during cleaning and enables the cleaning subsystem 207 to perform the cleaning process simultaneous with device singulation. Intermittently cleaning the self-sharpening saw blades will reduce the occurrence of glazing and the possibility of damage to the semiconductor devices during the singulation process. In some implementations, it may be possible to maintain the cleaning module 213 in the configuration shown in FIG. 2E, such that the first and second cleaning blocks will be in position to clean the upper and lower surfaces of the saw blade as soon as any glaze accumulates there.

Although the invention has been described in the context of cleaning a self-sharpening saw blade, the invention can also be applied to clean saw blades that are not self-sharpening.

Although the invention has been described in the context of cleaning saw blades used to singularize semiconductor integrated circuit dies fabricated on a semiconductor wafer. The invention can also be applied for saw blades used to singularize other types of semiconductor devices, such as semiconductor devices assembled on lead frame arrays.

Although the invention has been described using relative terms such as "upper," "lower," "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. An apparatus for singularizing semiconductor devices, the apparatus comprising:
    a spindle module configured to rotate a saw blade used to saw through wafers or a multi-device array during a singulation process;
    a moveable, cleaning module configured to translate relative to the spindle module to achieve a position at which the cleaning module removes material from the saw blade; and
    a controller configured to move the cleaning module in relation to the spindle module to perform a cleaning operation.

2. The apparatus of claim 1, wherein the cleaning module comprises first and second cleaning blocks.

3. The apparatus of claim 2, wherein the first cleaning block has a first surface cleaning surface and the second cleaning block has a second surface cleaning surface, wherein the first and second surface cleaning surfaces are parallel in order to clean top and bottom surfaces of the saw blade.

4. The apparatus of claim 3, wherein the cleaning module further comprises a spring-based mechanism configured to control a distance between the two cleaning blocks.

5. The apparatus of claim 2, wherein each cleaning block has an edge-cleaning surface in order to clean an outer edge of the saw blade.

6. The apparatus of claim 1, further comprising:
    an X-axis guide for moving the cleaning module along an X-axis in relation to the spindle module; and
    a Y-axis guide for moving the cleaning module along a Y-axis in relation to the spindle module.

7. The apparatus of claim 1, wherein the controller is configured to perform the cleaning operation after a predetermined time interval.

8. The apparatus of claim 1, wherein the controller is configured to perform the cleaning operation after a predetermined number of cuts during the singulation process.

9. The apparatus of claim 1, wherein the controller is configured to perform the cleaning operation after detection of a relatively high loading current.

10. A method for removing material from a saw blade of a singulation saw used to cut through wafers or a multi-device array during a singulation process, the method comprising:

rotating the saw blade on a spindle module of the singulation saw; and moving a cleaning module of the singulation saw relative to the spindle module to remove the material from the saw blade, wherein, in the cleaning module moving step, the cleaning module is moved to a position to remove the material from an outer edge of the saw blade.

11. The method of claim 10, further comprising determining a home position and feed distance for the cleaning module.

12. The method of claim 11, wherein the home position is determined through the saw blade parameter in a dicing saw program, while feed distance of the cleaning module is determined based on measurement of a radius of the saw blade.

13. The method of claim 10, wherein, in the cleaning module moving step, the cleaning module is moved to a position to remove the material from upper and lower surfaces of the saw blade.

14. The method of claim 10, wherein the cleaning module moving step comprises moving the cleaning module after detecting passage of a predetermined time interval.

15. The method of claim 10, wherein the cleaning module moving step comprises moving the cleaning module after detecting occurrence of a predetermined number of cuts during the singulation process.

16. The method of claim 10, wherein the cleaning module moving step comprises moving the cleaning module after detecting a relatively high loading current for the spindle.

* * * * *